United States Patent [19]

Weir

[11] 3,750,040

[45] July 31, 1973

[54] TRANSISTOR DELAY LINE DRIVER

[75] Inventor: James D. Weir, State College, Pa.

[73] Assignee: The United States of America as represented by the Secretary of the Navy, Washington, D.C.

[22] Filed: June 21, 1972

[21] Appl. No.: 265,089

[52] U.S. Cl. .................... 330/24, 330/19, 330/25, 330/28

[51] Int. Cl. .................... H03f 3/04, H03g 3/30

[58] Field of Search .................... 307/315; 330/19, 330/24, 25, 26, 28, 32, 35, 53, 54

[56] References Cited

UNITED STATES PATENTS 3,214,705 10/1965 Smith et al. .................... 330/24 X 3,555,442 1/1971 Gardner .................... 330/25 X

*Primary Examiner*—Roy Lake

*Assistant Examiner*—Lawrence J. Dahl

*Attorney*—R. S. Sciascia et al.

[57] ABSTRACT

The invention disclosed herein relates to a transistor current amplifier usable as a delay line driver. The current amplifier incorporates a high gain amplifier including a transistor, a Field Effect Transistor (FET), and two Darlington-connected transistors providing the bias current through the resistor for the first transistor and feedback current through the resistor.

6 Claims, 1 Drawing Figure

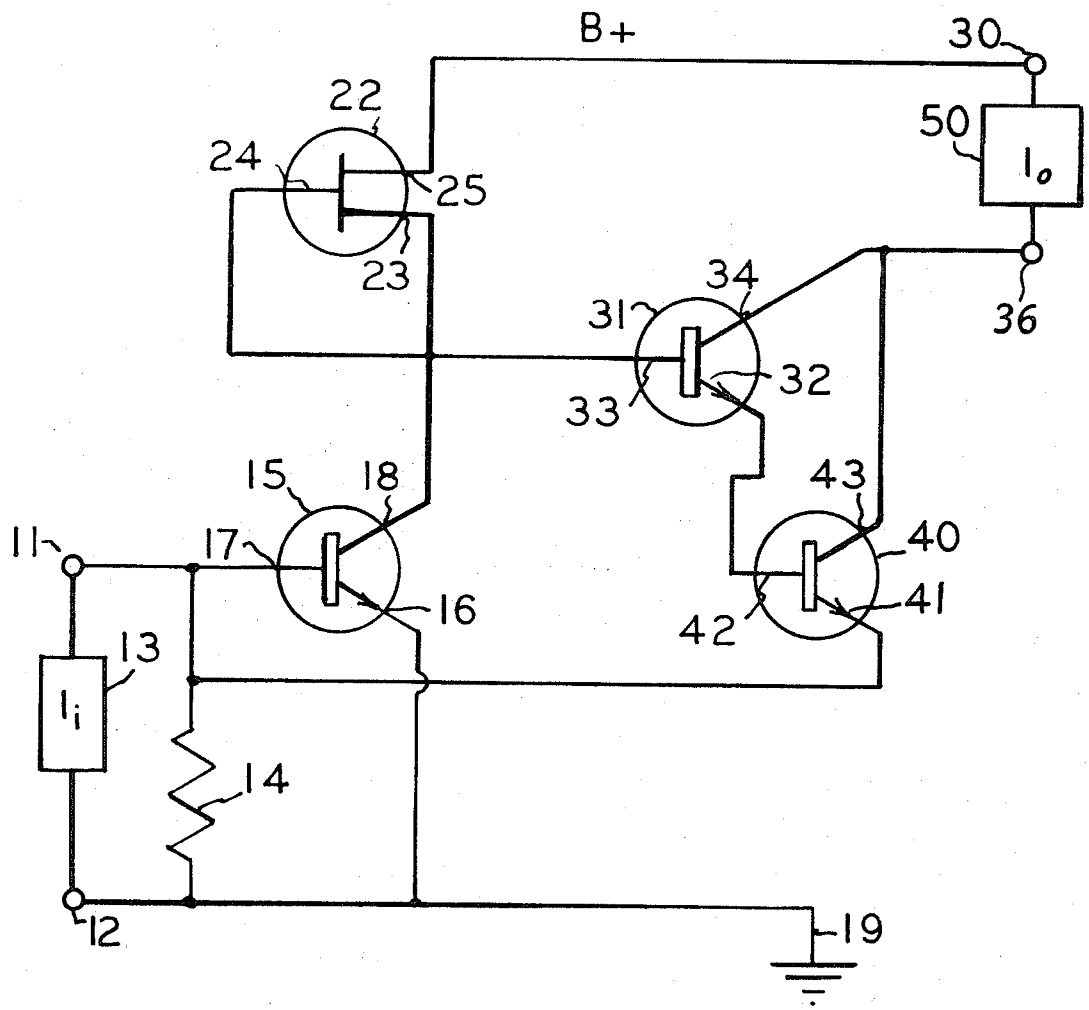
B+
30
22
24
25
50
$I_o$
23
34
31
36
32
33
15
18
43
40
11
17
16
42
41
13
$I_i$
14
12
19

TRANSISTOR DELAY LINE DRIVER

The Invention described herein may be manufactured and used by or for the Government of the United States of America for governmental purposes without the payment of any Royalties thereon or therefor.

Beam forming using linear transducer arrays can be accomplished using delay lines with the beam angle being determined by the delay between taps on the line. In order to prevent undesirable loading of the delay line, the output impedance of the drivers should be high; in other words, the driver should be a current amplifier.

Certain features in addition to high output impedance are desirable, such as; low noise, low input impedance, stability, simplicity, and low cost. A transistor current amplifier meeting these requirements is the subject of this application.

It is therefore an objective of this invention to provide an improved precision current amplifier having first and second input terminals, a resistive element coupled across the input terminals, a first transistor having a first base first emitter and first collector terminals, the first base terminal connected to the first input terminal and the first emitter terminal connected to the second input terminal, a second transistor having second base, second emitter, and second collector terminals, the second base terminal connected to the first collector terminal and the second collector terminal connected to the first collector terminal. A third transistor having third base, third emitter, and third collector terminals, the third base terminal connected to the first collector terminal, a fourth transistor having fourth base, fourth emitter, and fourth collector terminals, the fourth base terminal connected to the third emitter terminal, the fourth emitter terminal connected to the first base terminal, the fourth collector terminal connected to the third collector terminal and first and second output terminals, the first terminal connected to the second emitter terminal, the first output terminal connected to the second emitter terminal and the second output terminal connected to the third and fourth collector terminals.

It is yet a further objective of this invention to provide a stable amplifier with regard to gain and insensitive to component variations.

It is still a further objective of this invention to provide a circuit with low input impedance and having a high output impedance.

It is even a further objective of this invention to provide a low cost circuit providing the desired construction set forth above.

Other objects, advantages and novel features of the invention will become apparent from the following detailed description of the invention when considered in conjunction with the accompanying drawing wherein:

The single FIGURE is one embodiment of the invention.

First and second input terminals 11, 12 are shown coupled across a current drawing device 13. In addition, resistor 14 is connected across terminals 11 and 12. A first transistor 15 has a first emitter terminal 16, a first base terminal 17 and a first collector terminal 18. It should be noted that emitter terminal 16 is connected to input terminal 12, one end of resistor 14 and a ground connect point 19.

A Field Effect Transistor designated as second transistor 22 is shown having a second collector terminal 23, a second base terminal 24 and a second emitter terminal 25. The collector terminal 23 is connected to first collector terminal 18 and coupled back to second base terminal 24. The second emitter terminal of transistor 22 is connected to a first output terminal 30 designated as B plus.

A third transistor designated as 31 has a third emitter terminal 32, third base terminal 33 and third collector terminal 34. The base terminal 33 is connected to collector terminal 18 of transistor 15, collector terminal 23 of transistor 22 and to base terminal 24 of transistor 22. The third collector terminal 34 is connected to a second output terminal designated as 36, a fourth transistor 40 has a fourth emitter terminal 41, a fourth base terminal 42 and a fourth collector terminal 43. The fourth base terminal 42 is connected to the third emitter terminal 32, the fourth collector terminal 43 is connected to the third collector terminal 34 of transistor 31 and to the output terminal 36. The fourth emitter terminal 41 is connected to input terminal 11. A output load device 50 would, in the embodiment of the invention shown, be a delay line 50 coupled across output terminals 30, 36.

In the FIGURE, transistor 15 and Field Effect Transistor 22 comprise a high gain dc amplifier. Darlington connected transistors 31 and 40 provide bias current through resistor 14 for transistor 15. The Darlington state 31 and 34 also supplies current feedback through resistor 14.

When a current is applied it causes a voltage drop across resistor 14 which is amplified by transistor 15. The amplified voltage is fed back out of phase through transistor 31 and transistor 31 to resistor 14. This reduces the voltage drop through resistor 14 due to the current by an amount approximately equal to the gain of transistor 15. Since the voltage across resistor 14 is forced to remain constant, the impedance across resistor 14 is approximately resistor 14 divided by the gain of transistor 15.

The current through transistor 31 and transistor 40 is equal to current in 13 to within 0.1 percent. $I_o$ then equals $0.999I_i$. The output impedance looking into the collectors of transistor 31 and transistor 40 is greater than 2 meg. ohms with commonly available transistors.

One of the desirable features of this amplifier is stability. Stability in this application refers to gain stability, or lack of gain variation from amplifier to amplifier, and gain stability which is insensitive to component variations within tolerances. An objective in the design is to achieve stability such that gain variations would not exceed 0.1 percent. The circuit shown in the drawing meets this objective.

Low input impedance is another desirable feature; a value of 0.1 ohm or less is the objective. The reason for low input impedance is to permit the input to be used as a summing junction, which, for the embodiment shown would eliminate an operational amplifier. A value of 0.02 to 0.05 ohm can be realized with this circuit.

An output impedance of 200,000 ohms is desired. This value is more than 100 times the delay line impedance and is high enough that delay line loading will not occur. A minimum value for the circuit in the drawing using low Beta transistors was 2.5 megohms. Using high Beta transistors such as the 2N3391A, the output impedance is greater than 5 megohms.

Simplicity and low cost are evident from the schematic diagram. Cost of components is approximately $2.00.

Low noise is one of the most important requirements since the use is in low-level input stages. The goal was to achieve a noise equal to or less than a 4,000 ohm resistor, which at the operating frequency is −162 dBv in a 1-cycle band. A level of −170 dBv is achieved.

Obviously many modifications and variations of the present invention are possible in the light of the above teachings. It is therefore to be understood that within the scope of the appended claims the invention may be practiced otherwise than as specifically described.

I claim:

1. An improved precision current amplifier having low input impedance and high output impedance capabilities comprising:

a. first and second input terminals;

b. a resistive element coupled across said input terminals;

c. a first transistor having first base, emitter, and collector terminals, said first base terminal connected to said first input terminal, and said first emitter terminal connected to said second input terminal;

d. a second transistor having second base, emitter, and collector terminals, said second base terminal connected to said first collector terminal and said second collector terminal connected to said first collector terminal;

e. a third transistor having a third base, emitter, and, collector terminals said third base terminal connected to said first collector terminal;

f. a fourth transistor having fourth base, emitter, and collector terminals, said fourth base terminal connected to said third emitter terminal, said fourth emitter terminal connected to said first base terminal, said fourth collector terminal connected to said third collector terminal; and g. first and second output terminals, said first terminal connected to said second emitter terminal and said second output terminal connected to said third and fourth collector terminals.

2. The improved precision current amplifier of claim 1 wherein said first and second input terminals are connected across a current load device.

3. The device of claim 2 wherein said second transistor is a field effect transistor.

4. The device of claim 3 wherein said first, third and fourth transistors are high Beta type transistors.

5. The device of claim 4 wherein said output terminals are connected to a delay line device.

6. The device of claim 5 wherein said third and fourth transistors are connected in a Darlington type configuration.

* * * * *